United States Patent [19]
Lamartine et al.

[11] Patent Number: 5,721,687
[45] Date of Patent: Feb. 24, 1998

[54] ULTRAHIGH VACUUM FOCUSED ION BEAM MICROMILL AND ARTICLES THEREFROM

[75] Inventors: Bruce C. Lamartine; Roger A. Stutz, both of Los Alamos, N. Mex.

[73] Assignee: The Regents of the University of California Office of Technology Transfer, Alameda, Calif.

[21] Appl. No.: 382,345

[22] Filed: Feb. 1, 1995

[51] Int. Cl.⁶ ............................. G06F 19/00; A61N 5/00
[52] U.S. Cl. ......................... 364/474.08; 250/492.2; 250/492.3; 369/101
[58] Field of Search ................ 364/474.01, 474.08, 364/474.02, 468.24, 468.25, 468.28; 369/101, 109, 121, 112, 122, 272, 275.1; 365/106, 118; 250/306, 307, 308, 492.1, 492.21, 492.22, 492.3, 492.2; 219/121.61, 121.62

[56] References Cited

U.S. PATENT DOCUMENTS

| | | | |
|---|---|---|---|
| 5,401,972 | 3/1995 | Talbot et al. | 356/400 |
| 5,402,410 | 3/1995 | Yoshimura et al. | 369/275.1 |
| 5,453,594 | 9/1995 | Konecny | 364/474.08 |

Primary Examiner—Reba I. Elmore
Assistant Examiner—Thomas E. Brown
Attorney, Agent, or Firm—Bruce H. Cottrell

[57] ABSTRACT

An ultrahigh vacuum focused ion beam micromilling apparatus and process are disclosed. Additionally, a durable data storage medium using the micromilling process is disclosed, the durable data storage medium capable of storing, e.g., digital or alphanumeric characters as well as graphical shapes or characters.

2 Claims, 6 Drawing Sheets

ULTRAHIGH VACUUM FOCUSED ION BEAM MICROMILL AND ARTICLES THEREFROM

This invention is the result of a contract with the Department of Energy (Contract No. W-7405-ENG-36).

FIELD OF THE INVENTION

The present invention relates to a process of micromilling materials with a high aspect ratio and to articles prepared by such a process such as high density durable data storage media.

BACKGROUND OF THE INVENTION

Ion micromilling is presently conducted under a medium vacuum of about $10^{-6}$ Torr. Aspect ratios, i.e., ratios of milled depth to horizontal cut, are generally limited to around 10 to because of redeposition of sputtered material caused by scattering from the residual gas within the system. A need has remained for a process of milling with an increased aspect ratio.

While the storage of information or data has seen revolutionary changes in the past century, the long term storage and interpretation of such data may present an important problem. Rothenberg, Scientific American, pp. 42–47, 1995, describes the problems associated with the longivity of documents.

The storage of information or data storage has commonly involved the use of magnetic or optical recording carriers. Recently, the use of scanning tunnel microscopes (STM's) has been investigated for the writing and reading of storage information by means of topographical changes to flat metal surfaces. Wiesendanger, J. Vac. Sci. Technol. B, v. 12, no. 2, pp. 515–529 (1994), reviews STM and similar scanning probe microscopy in fabrication of nanometer-scale structures and the unresolved problems of the limited temporal stability of such nanometer-scale structures. Other similar references include: Adamchuk et al., Ultramicroscopy v. 45, pp. 1–4 (1992), describing the use of an STM to microprocess nanometer-sized craters of about 50 nanometers (nm) in diameter and 10 nm in depth in gold films on flat silicon substrates; Li et al., Appl. Phys. Lett., v. 54, no. 15, pp. 1424–1426 (1989), describing electroetching nanometer-sized craters about 2 nm in diameter and up to about 1 nm in depth in flat gold substrates with a STM operating in air; Silver et al., Appl. Phys. Lett., v. 51, no. 4, pp. 247–249 (1987), describing the direct writing of submicron metallic features by deposition of a new substance (cadmium from organometallic gas) on a surface with a STM; and, Abraham et al., IBM J. Res. Develop v. 30, no. 5, pp. 492–499 (1986), describing surface modification with a STM via surface diffusion and mention the possibility of high density memory storage. The present data storage systems each suffer from one or more problems including the long term stability or durability of the medium.

It is an object of this invention to provide a process of milling with an increased aspect ratio greater than about 10, preferably up to about 50.

It is another object of this invention to provide articles of manufacture formed by the present milling process, such articles including, e.g., durable data storage media.

SUMMARY OF THE INVENTION

To achieve the foregoing and other objects, and in accordance with the purposes of the present invention, as embodied and broadly described herein, the present invention provides a process of machining a microstructure of high aspect ratio within a target substrate including placing a target substrate within an ultrahigh vacuum environment, producing a computer data file adapted for operation of a computer-controlled focused ion beam during formation of a milled microstructure in said target substrate, and exposing the target substrate to the computer-controlled focused ion beam, the computer-controlled focused ion beam controlled by software utilizing the computer data file whereby a milled microstructure of high aspect ratio is formed in said target substrate.

The present invention further provides a durable data storage medium comprising a substrate having milled characters therein, said milled characters having an aspect ratio of depth to width of from about 1 to about 50. The storage medium can include milled characters selected from the group consisting of digital characters, alphanumeric characters, glyphical characters and 3-D graphical characters.

DETAILED DESCRIPTION

The present invention is concerned with a micromilling process for small-scale fabrication down to the nanometer-scale and to articles fabricated by this process. In the present process, micromilling is conducted under an ultrahigh vacuum, i.e., a vacuum of less than about $10^{-9}$ Torr, preferably a super high vacuum in the range of from about 50 to about 120 picoTorr ($6.3 \times 10^{-11}$ - $1.6 \times 10^{-10}$ millibar).

The micromilling process of the present invention can achieve high aspect ratios, i.e., milled depth to horizontal cut (width), of greater than about 10, generally up to about 50. With such high aspect ratios, the present process can serve as a valuable tool for cross-sectioning and depth-profiling on a submicron lateral scale. This would allow, for example, failure analysis of a submicron metallization deep in an integrated circuit to check for trace elemental contaminants by use of a suitable Auger analyzer or secondary ion mass spectrometer in conjunction with the apparatus used for the present process.

The micromilling process of the present invention can be used for fabrication of, e.g., beams, levers, capacitors, lenses, diffraction gratings, waveguides, bandpass filters, antennas, and fasteners, each of a high feature aspect ratio for ultrasmall chemical, electronic and mechanical sensors. Further, the micromilling process can be used for the recording of data upon a suitable substrate. Such data can be recorded as characters upon the substrate using, e.g., digital or numeric characters, alphabetic or alphanumerical characters, and graphical or glyphical characters, i.e., characters in the form of a three dimensional (3-D) graphic or picture. By "character" is generally meant any symbol representative of a writing or communicative system and within the present process of recording data it can include any feature distinguishable from the surface background of the substrate. A binary system of recording data can also be employed wherein a binary data character is represented by a single surface depression upon the substrate or by the absence of such a single surface depression upon the substrate.

Figure 1:
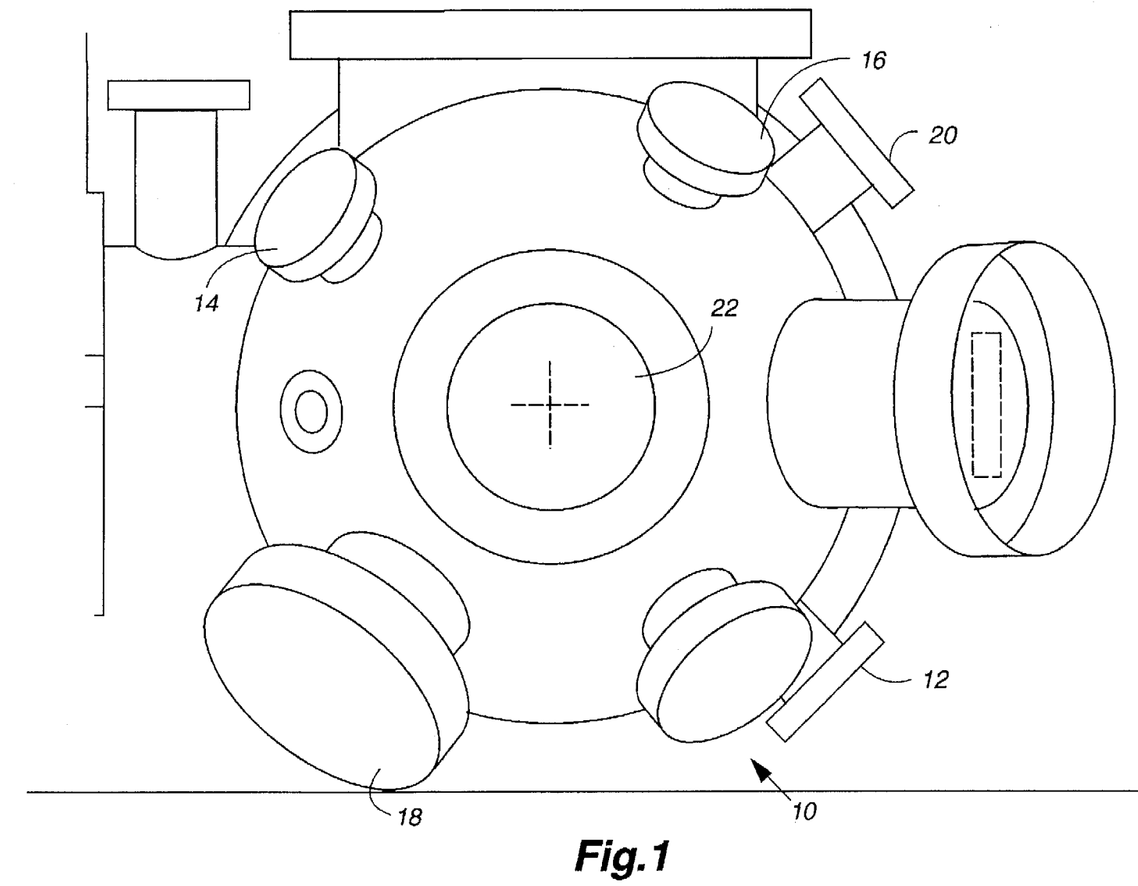
FIG. 1 shows a top view of a chamber employing an ultrahigh vacuum-focused ion beam system in accordance with the present invention.
Figure 2:
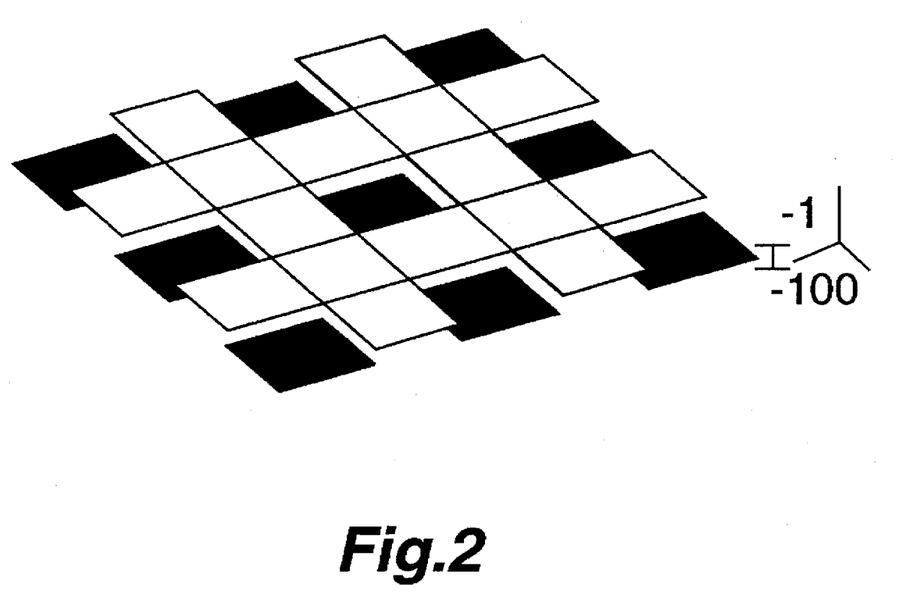
FIG. 2 shows a plot of grating lines rotated 85 degrees to show resolution detail with such representing how an Ion-mill Version 2.5 would mill the pattern.

FIG. 1 shows a chamber employing the ultrahigh vacuum-focused ion beam system employable in the practice of the present process or in forming the data storage media. In FIG. 1, a ultra-high vacuum chamber 10 includes a number of ports for viewing of the target substrate, for filming of the target substrate, for insertion or manipulation of the target substrate, and for various analyses of the target substrate such as from secondary electron emission. Port 12 can be a view port with port 14 being used for a camera port. Other view ports 16 and 18 are shown as is a roughing pump port 20. Another port 22 contains the ion beam gun driven by appropriate software. Multiple ion beam guns may be used if desired to speed additional milling.

In contrast to earlier milling systems, the present process can achieve high aspect ratios in a chemical-assist free environment. That is, no chemical-assist needs to be added to the system to achieve the aspect ratios of greater than 10 up to at least about 50. By "chemical-assist", it is meant a reactive gas such as typically chlorine added to react with sputtered material and reduce any redeposition.

Among the materials that can be milled by the micromilling process of the present invention are included refractory metals such as iridium, tantalum, tungsten, molybdenum and niobium, elements of the first row transition metals in the periodic table such as scandium, titanium, vanadium, chromium, manganese, iron, cobalt, nickel, and copper, and vacuum compatible semiconductors such as silicon and gallium arsellide. Other materials may include high temperature insulators such as alumina, ruby, sapphire, silica or quartz so long as any attendant electric charge can be compensated by an auxiliary electron gun or other suitable means during the milling.

Figure 6:
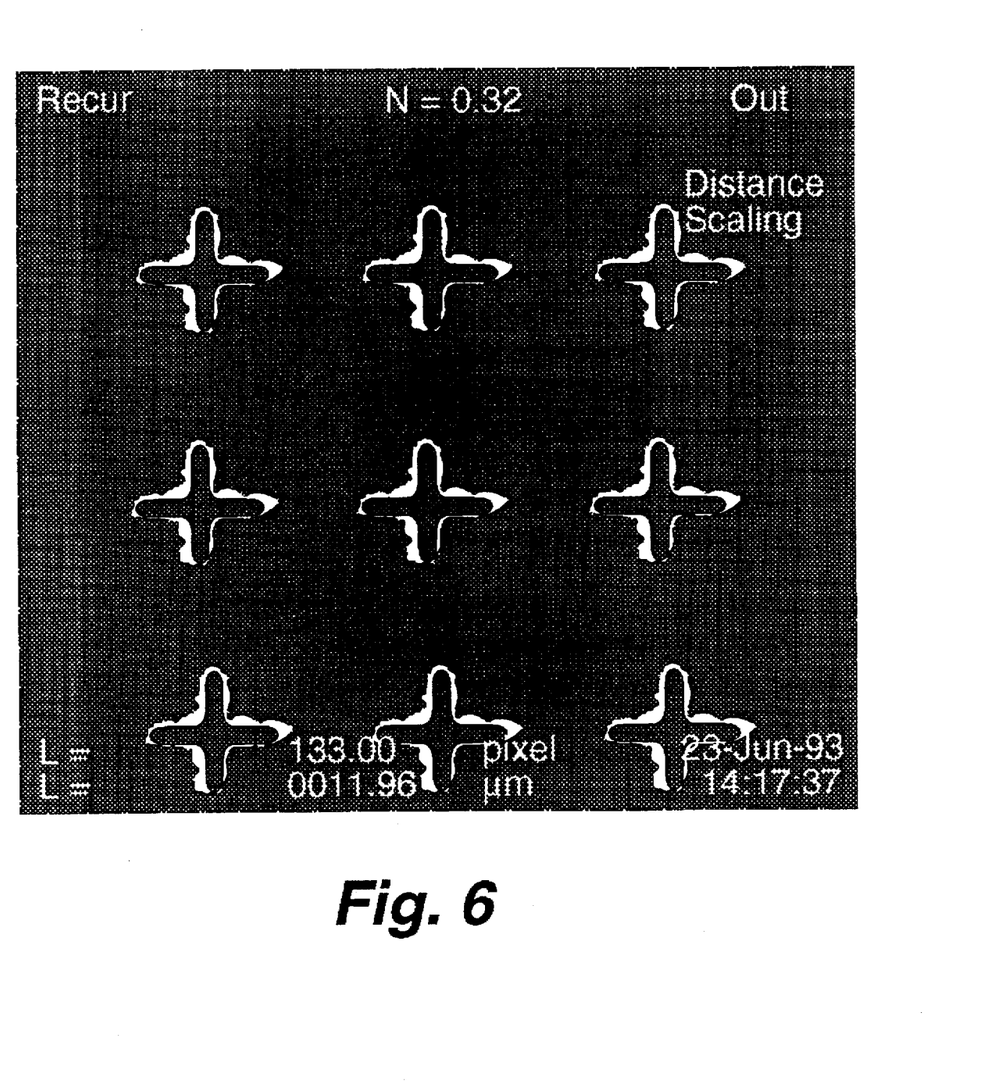
FIG. 6 shows a bandpass filter formable by the process of the present invention.

In one embodiment of the micromilling process of the present invention, transmission diffraction gratings have been fabricated which were then used as infrared bandpass filters. One grating material used was pulsed gas alumina, a conductive film of approximately 2-5 microns thickness. Diffraction elements milled completely through the film were positioned in a regular array such that the diffraction intensities through the array could be modeled by conventional Rayleigh optics calculations. A resultant grating of the type and dimensions shown in FIG. 6 produced major bandpass at 11-12 microns (infrared) as expected. Use of this process presents an alternative to conventional LIGA (Synchrotron X-ray lithography and electroforming) as described by Microparts Gesellschaft fur Mikrostructurtechnik, Karlsruhe, Germany in that the diffraction elements are smaller than those reported on or about May 1993 by Microparts. Because the spot size of the ion beam can be made extremely small (ca. 50 nm or less, it is expected that use of ultrahigh vacuum focused ion micromilling could be reasonably extended to produce transmission diffraction gratings which bandpass ultraviolet or visible light at acceptably high transmission.

In another embodiment of the micromilling process of the present invention, the micromilling process can be used for data storage upon, e.g., metal and semiconductor materials. Such data storage can be of high density and can be highly durable. By "high density", it is meant that a small dowel-shaped medium of about 1/16 inch in diameter and about 1 inch in length containing milled characters of about one square micron can hold up to about 1 gigabyte of ASCII information if it is assumed that each Latin character is equivalent to 8 bits or 1 byte. An equivalent binary representation would, by comparison, allow 4 gigabytes of information to be written in the same space.

The data storage media of the present invention offers an extremely durable media for the storage of data with such media generally capable of surviving electromagnetic pulses, radio-frequency (RF) interference, magnetic fields, exposure to common solvents including but not limited to water, alcohols and acetone, thermal gradients and fires. The data storage media can offer advantages of high reliability in comparison to magnetic/magneto-optical media thereby reducing the need to replace backup data, can offer a low capital cost for storage data in terms of the actual substrate, e.g., a steel dowel pin can serve as the actual storage material for milling of the data. Other advantages of such data storage media can be that the character etch milling is an environmentally benign dry process, that there should not be embrittlement of the medium over time, and that the medium can be recycled or reused if desired by grinding and polishing of the medium.

In one embodiment of the data storage application of the present milling process, a suitable substrate can be formed into a preformatted media by pre-milling a series of individual surface depressions representative of one type of binary characters, i.e., either ones or zeros. In one manner of accelerating the process of subsequent data storage system, the pre-milled substrate can be backfilled with an overcoat material characterized as more easily and quickly removable than the substrate material itself, but durable and resistant to inadvertant degradation of the overcoat material. The overcoat material can then be removed only for those characters needed to change the binary character representation. In another manner, pre-casting of a series of individual bumps representative of one type of binary characters, i.e., either ones or zeros can be formed upon a suitable substrate. Such pre-casting can use a material such as polyvinyl alcohol, polystyrene, and spin-on glass in thicknesses, e.g., of up to about 75 microns. Then, the requisite bumps of the pre-cast material can then be removed only for those characters needed to change the binary character representation.

One problem typically associated with the long term storage of data relates to the methods that will be used to read the data hundreds to thousands of years after it is written. The benefit of the present micromilling process for data storage is that it allows the storage of data in several formats and densities upon the same media. For example, the protocol used to store the data can be written at one data density (size) that could be man-readable with simple tools or even by simply vision or minor magnification. Then, the protocol could be used to read the remaining data written at the higher density (small size) and in a different format. Thus, in effect a type of "Rosetta Stone" can be created that allows the decoupling of information from storage and retrieval methods and provides the necessary key to be used to read the stored data far into the future. In contrast to the original "Rosetta Stone", the present data storage medium uses different sizes of information rather than just one, and the present data storage medium does not repeat the actual data but simply provides a key for reading the remaining data.

The data storage system of the present invention can allow for the storage of multiple types of information in a single storage medium, i.e., both alphanumeric and graphical or glyphical characters can be milled into a single substrate and both types of information can then be retrieved. In another manner, various sizes of characters can be milled into a single substrate. Among the various sizes can be included small sizes targeted for the efficient storage of large amounts of data as well as large sizes targeted for visual observation by the unaided human eye. In this manner, large amounts of data can be stored on a substrate, yet it would be apparent to an individual seeing the data storage system at some later date, even much later in the future, that there was information stored upon the substrate. Further, large size instructions regarding how to read the small size characters can be included directly upon the substrate. The small size characters can then be included in the remaining area of the substrate around the large size structures or may even be included within the milled areas of the larger size characters.

In another embodiment of the present invention, the micromilling process can be used to form an antenna. As a basic monopole antenna is a resonant structure that acts as a bandpass filter, if the radio frequency of interest is in the bandpass of the antenna, a signal will be present at the antenna output. A radio wave (RF signal) is normally detected using a derivative displacement field detector, which is an antenna. Often there are benefits from using arrays of antennas to improve signal to noise thus improving the performance of the antenna system. By use of the present micromilling process, very small antennas and antenna arrays can be produced and such small size antennas and antenna arrays can allow an increase in the frequencies of potential interest. One application would be the use of a small antenna connected to a capacitively-charged-coupled device (CCCD) thereby producing a "picture" using the RF signal as the light source.

In the process for micromilling for data storage, three separate procedures can be employed for the production of digital, alphanumeric, and 3-D dimensional image data. All procedures ultimately produce a file called a millstream file which can be read and rapidly processed by a commercial digital-to-analog converter. The file is of the form:

s
nf
t[1]x[1]y[1]
.
.
.
t[np]x[np]y[np], where
s=3-dimensional mode designator; nf=number of frame repetitions; np=total number of data lines; t[i]x[i]y[i]t[i]=beam dwell time in nanoseconds; x[i]=horizontal position in digital-to-analog converter units (0–4095); and, y[i]= vertical horizontal position in digital-to-analog converter units (0–4095). The entries s, nf and np are collectively known as the millstream header. Note that the digital and alphanumeric data modes employed are actually restricted cases of 3-dimensional image milling. Separate software can be used for simple line and box milling, and such software available as Ionmill Version 2.5 from FEI Co.

Processing of digital data for control of the ion milling can be as follows: Digital data can be first derived mathematically or read in by Mathcad 4.0, a commercial numerical and graphics package using the following software developed to run within Mathcad. For example, the following array of alternating ones and zeros was used to generate a digital array of corresponding ion beam dwell times:

$$F = \begin{bmatrix} 0 & 1 & 0 & 1 & 0 & 1 & 0 & 1 \\ 1 & 1 & 1 & 1 & 1 & 1 & 1 & 1 \\ 0 & 1 & 0 & 1 & 0 & 1 & 0 & 1 \\ 1 & 1 & 1 & 1 & 1 & 1 & 1 & 1 \\ 0 & 1 & 0 & 1 & 0 & 1 & 0 & 1 \\ 1 & 1 & 1 & 1 & 1 & 1 & 1 & 1 \\ 0 & 1 & 0 & 1 & 0 & 1 & 0 & 1 \\ 1 & 1 & 1 & 1 & 1 & 1 & 1 & 1 \end{bmatrix}$$

Test patterns can be generated for subsequent use in ion milling. For example, the digital array mentioned above can be created in the software example below:

Set up calculation indices:
$n = 4 \quad m = n \quad i = 0 \ldots n \quad j = 0 \ldots m \quad q = (n+1) \cdot (m+1)$
$k = 0 \ldots q - 1$ Create the digital array (other formulae may be substituted):

$D_{i,j} = \text{if}[[(-1)^i > 0] \cdot [(-1)^j > 0], 0, 1]$

Create the dwelltime map:     Logical "and" operation:
$T_{i,j} := \text{if}(D_{i,j} \neq 1, -100, -1) \quad E_{i,j} := 1 \; F_{i,j} = D_{i,j} \cdot E_{i,j}$ Create an X,Y array:

$X_{i,j} := \text{floor}\left(\dfrac{4095i}{n}\right) \quad \text{WRITE}(X) = X_{i,j} \quad M_{x_k} := \text{READ}(X)$ $Y_{i,j} := \text{floor}\left(\dfrac{4095j}{n}\right) \quad \text{WRITE}(Y) = Y_{i,j} \quad M_{y_k} := \text{READ}(Y)$ $Mxy := \text{augment}(Mx, My)$ Create the mill file of dwell (x,y) in DAC units:

WRITE(T) = $T_{i,j}$   $Mt_k$ = READ(T)   Mtxy = augment(Mt,Mxy)
rows(Mtxy) = 25

PRNCOLWIDTH = 0
PRNPRECISION = 4
WRITEPRN(NGRATE2): = Mtxy

Variations of this example were obtained by adjusting values or parameters of n, m, D, T, and E. These intermediate files (e.g., NGRATE2.prn) are left-justified and only a single space separates t,x,y values. This is the file structure required by the commercial ionmill software package from FEI Co. Subsequent file processing requires the removal of the minus signs, a left registry shift, and the attachment of the appropriate header. It proved most convenient to write a conversion routine in BASIC to produce the final mill file xxx.str from the intermediate xxx.prn file. An example of the preferred file conversion routine is shown below.

```
100  CLS : SCREEN 9: COLOR 14, 9
     PRINT
     PRINT "This program reads a MATHCAD XXX.PRN file and a XXXH.PRN"
     PRINT "header file and produces an FEI Millstream file XXX.STR"
     PRINT
     PRINT "Data of the form:"
     PRINT
```

-continued

```
        PRINT "-aaa bbbb cccc become"
        PRINT "aaa bbbb cccc behind a millstream header"
        PRINT
        PRINT "                              "

PRINT "CAUTION !!!! Existing XXX.STR files will be overwritten."
        PRINT "----------------------------------------"
        PRINT
        INPUT "Continue? (y/n)", GO$
        IF GO$ = "n" OR GO$ = "N" THEN GOTO 1000
        PRINT "Enter a MATHCAD filename from drive C"
        INPUT "(Existing file only; no .PRN extension)"; FILEN$
        PRINT
        DRIVE$ = "C:\WINMCAD\"
        FILENM$ = DRIVE$ + FILEN$ + ".PRN": PRINT FILENM$:
PRINT
        REM THE HEADER CONVENTION IS E.G., GEAR5H.PRN
        FOR A FOR A DATA REM FILE OF GEAR5.PRN
        FILENMHDR$ = DRIVE$ + FILEN$ + "H" + ".PRN": PRINT
FILENMHDR$
        FILENMSTR$ = DRIVE$ + FILEN$ + ".STR": PRINT FILENMSTR$
        OPEN FILENMHDR$ FOR INPUT AS #1
        OPEN FILENMSTR$ FOR OUTPUT AS #3
        CLS : PRINT
        PRINT "Please note that a file of 16384 lines takes about 3
seconds to translate"
        PRINT "on a 486-50 machine. Allow proportionate time
for other file sizes. The max-"
        PRINT "imum translation time for a millstream file of
262 K lines is therefore about"
        PRINT "48 seconds + buffer time, or about 78 seconds
total time."
        PRINT
        INPUT "Continue? (y/n)", GO$
        IF GO$ = "n" OR GO$ = "N" THEN GOTO 1000
        ON TIMER(1) GOSUB 2000
        TIMER ON
        T = TIMER
        STRID$ = "s"
        PRINT #3, STRID$
        DO UNTIL EOF(1)
            LINE INPUT #1, HDRS$
            HDR$ = RIGHT$(HDRS$, LEN(HDRS$) − 1)
            PRINT #3, HDR$
        LOOP
        CLOSE #1
        OPEN FILENM$ FOR INPUT AS #2
        DO UNTIL EOF(2)
            LINE INPUT #2#, LINE$
            LIN$ = RIGHT$(LINE$, LEN(LINE$) − 1)
            PRINT #3, LIN$
        LOOP
        TIMER OFF
        DONE$ = FILENMSTR$ + " Complete"
        PRINT
        LOCATE 9, 30
        PRINT DONE$
        CLOSE #2
        CLOSE #3
        PRINT
        INPUT "Do a file check?", G$
        IF G$ "n" OR G$ = "N" THEN GOTO 900
        OPEN FILENMSTR$ FOR INPUT AS #3
        INDEX = 0
        ON TIMER(1) GOSUB 2000
        TIMER ON
        T = TIMER
        DO UNTIL EOF(3)
            LINE INPUT #3, MILLSTR$
            INDEX = INDEX + 1
            INDX = INDEX − 3
        LOOP
        TIMER OFF
            LOCATE 11, 11
            PRINT " # of t,x,y values ="; INDX, MILLSTR$
            CLOSE #3
        PRINT
900     INPUT "Do another? (y/n)", G$
        IF G$ = "n" OR G$ = "N" THEN GOTO 1000
        GOTO 100
```

```
1000  END
2000  REM ELAPSED TIME SUBROUTINE
      TNEW = TIMER
      TELAPSED = INT(TNEW - T)
      LOCATE 7, 45
      PRINT "Time (sec) ="; TELAPSED
      RETURN
```

Alternatively, any text editor package can be used to convert files for this purpose. Convenient packages include the "Find and Replace" features of Microsoft Word for Windows, Version 2.0. Typically, the "find" operation can locate, e.g., "-" and the "replace all" operation can be used to convert to " ". The left registry shift can then be accomplished automatically. Then, the processed file can be stored as xxx.txt and finally, the millstream header is attached to the xxx.txt file and stored as xxx.str, a file compatible with FEI Co. Ionmill software Version 2.5.

Figure 3:
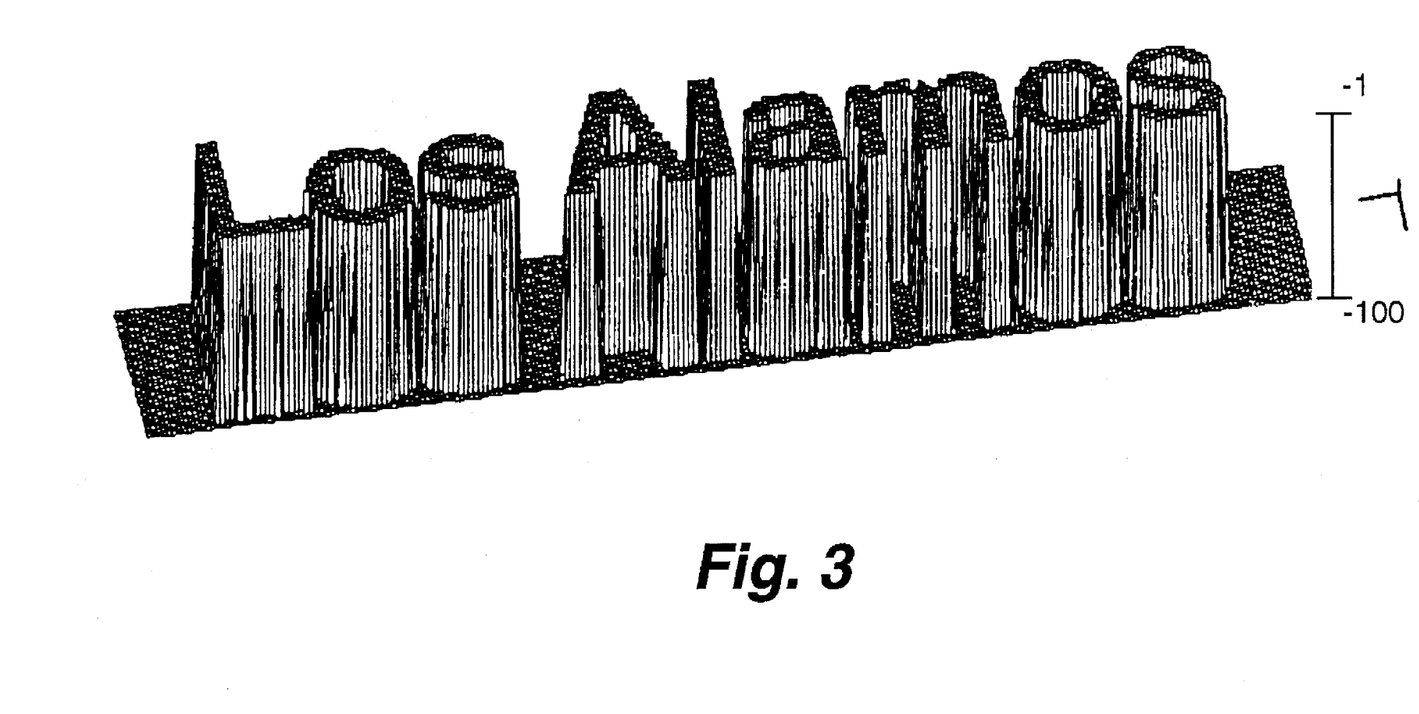
FIG. 3 shows a Raw I (x,y) file for generating alphanumeric milling.

Alphanumeric data such as man-readable characters, exposure masks, business card logos, or any item which can be placed in a flatbed scanner to produce a grayscale image, or any video frame grabber output falls into this category. In general, the processing scheme is to (1) scan the item (e.g., a textbook page) and electronically crop out the relevant image area; (2) enchance the contrast in the selected area; (3) convert to a black and white image; (4) save the converted image as, e.g., a PostScript file; (5) remove the header and footer from the PostScript file and save as an ordered Mathcad file; (6) assign dwell times to the dark areas (e.g., black printed text); (7) vectorize the file (i.e., remove data from the unnecessary white areas); (8) produce a final millstream file as shown, e.g., in FIG. 3, using the method described above for digital data.

Operations (1)–(4) can be carried out in a commercial scanner package called Colorlab Version 4.0 With an Epson ES-300-C flatbed scanner with IBM-PC adapter using menu functions. Operation (5) can be done in Microsoft Word for Windows Version 2.0 using the Delete function(s). Operations (5)–(6) can be done using additional software developed to run inside Mathcad as in the example below.

$Q := \text{READPRN}(lanlblk)$ rows$(Q) = 239$ $N := \text{rows}(Q)$ cols$(Q) = 39$
$M := \text{cols}(Q)$
$i := 0 \ldots N-1$  $j := 0 \ldots M-1$  $k_i := N - 1 - i$
$QR_{k,j} = \text{if}(Q_{i,j} \neq 1, -1, -100)$
PRNCOLWIDTH = 0
PRNPRECISION = 4
WRITEPRN$(QRS2) := QR_{i,j}$
$Mt := \text{READPRN}(QRS2)$ $X_{i,j} := \text{floor}\left( \frac{4095}{N-1} - i \right)$ WRITEPRN$(XS2) := X_{i,j}$ $Mx := \text{READPRN}(XS2)$ $Y_{i,j} := \text{floor}\left( \frac{1023}{M-1} \cdot j + 1534 \right)$ WRITEPRN$(YS2) := Y_{i,j}$ $My := \text{READPRN}(YS2)$ $Mxy := \text{augment}(Mx,My)$  $Mtxy := \text{augment}(Mt,Mxy)$
WRITEPRN$(LA) := Mtxy$
$MRtxy := \text{READPRN}(LA)$ entries := rows$(MRtxy)$
entries = 9321
Note: the mirror image of $QR$ is
required to create the correct registry in the ion mill file.

This software is designed to read a file which was generated in Colorlab by scanning a printed logo and rendering a black and white postscript file. Then in Microsoft WinWord, the Postscript header and footer are removed, the grayscale text 0-F(hex) is replaced with 0–9(dec) (we have chosen the simplest case of 0–1(dec)), and every other character was replaced by a space so that single digits could be recognized (Set a very large page size in WinWord). There is no loss of resolution, but the number of columns in WinWord double (this example was executed at 72 lpi.). The file was stored as [an[blk.prn, a structured Mathcad file of 239 lines by 78/2=39 columns. The Los Alamos logo is rendered below. Operation (7) can then be done as described above for digital data.

Alternatively, operations (3)–(5) can be skipped, and the grayscale image can be saved as a TIFF (xxx.tif, several flavors), Windows Bitmap (xxx.bmp), Windows Paintbrush (xxx.pcx), TARGA (xxx.tga) or a grayscale Postscript file (xxx.eps). Then, using menu commands inside the software package Mocha Version 1.1, the pixel intensities can be extracted in array format and stored as a comma or space delimited ASCII string file (xxx.dat). Operation (6) can be then accomplished by yet another software routine also written to run inside Mathcad as in the example below.

This program will extract pixel intensity data from a Mocha V1.1 worksheet and produce an Ionmill xxx.prn precursor file for subsequent conversion to an Ionmill xxx.str file. N=# of x elements; M=# y elements; P=# of pixels=rows(Mt). Initial read file is lanllog.dat. Change as necessary for other file reads. Other changes: WRITEPRN(lanlmoc). We also incorporate a vectorizing rountine which reduces the size of the mill files to only the essectial pixels.

$N := 35$ $M := 279$ $P := N - M$ $i := 0 \ldots N-1$
$j := 0 \ldots M-1$ $k := 0 \ldots P-1$ $a := -100$ $b = 1$
$Q_{i,j} = \text{READ}(decin3)$
$Mt_k := \text{READ}(decin3)$ $Mt_k := \text{if}(Mt_k \leq 130, a, -1)$
rows$(Mt) = 9765$ cols$(Mt) = 1$ $X_{i,j} := \text{floor}\left[ 2047 + \left( i - \frac{N+1}{2} \right) \cdot b \right]$ $Y_{i,j} := \text{floor}\left[ 2047 + \left( j - \frac{M+1}{2} \right) \cdot b \right]$ WRITE$(xmoc) := X_{i,j}$ $Mx_k := \text{READ}(xmoc)$
WRITE$(ymoc) := Y_{i,j}$ $My_k := \text{READ}(ymoc)$
$Mtx := \text{augment}(Mt,Mx)$ $Mtxy := \text{augment}(Mtx,My)$
$Mtxy := \text{csort}(Mtxy,0)$
$t := Mtxy^{<0>}$ $w_k := \text{if}(t_k \neq 1, 1, 0)$ $s = \sum_k w_k$ $s = 1457$ $1 := 0 \ldots s-1$ WRITE$(sig0) := t$   $z_1 := \text{READ}(sig0)$ $\xi := Mtxy^{<1>}$   WRITE$(sig1) := \xi$   $x_1 := \text{READ}(sig1)$ $\psi := Mtxy^{<2>}$   WRITE$(sig2) := \psi$   $y_1 := \text{READ}(sig2)$ $Ntx := \text{augment}(z,x)Ntxy := \text{augment}(Ntx,y)Ntxy := \text{csort}(Ntxy,1)$
PRNCOLWIDTH := 0
PRNPRECISION = 4
WRITEPRN$(decin3) := Ntxy$
WRITE$(Mttmp) := Mt_k$ $R_{i,j} = \text{READ}(Mttmp)$ rows$(R) = 35$
cols$(R) = 279$ $p = \text{cols}(R)$
$q_{i,j} := |j - p + 1|$
$P_{i,q_j} := \text{READ}(Mttmp)$ The structure of the PostScript file for use in constructing Ionmill precursor files requires a xxx.eps header containing a "j" by "i" specification of characters. Spaces are then added between characters in a text editor such that the corresponding file size is doubled; e.g., 78×70 goes to 156×70, yet no resolution is lost. These files up to the accommodation limit of the Ionmill software can then be processed. Note however, that scanned images of text must be rotated +90 degrees in a trigonometry sense, i.e., counterclockwise; otherwise, a very slow matrix transformation function is required to produce the correct orientation for the Ionmill files.

3-D Image Data are actually stored as an ion-milled 3-D structure in a substrate material. All structures in this category can be described mathematically as dependent variable functions of the form $$z=t(x,y).$$

A further restriction is that, for a given set of x, y values, only one value of t is permitted. Physically, this rules out all milling sites not in line of sight of the ion beam. Sequential structural milling from a different orientation would, however, remove the single valued restriction of z.

Single orientation 3-D milling is usually done by calculating an array z[i,j], plotting its graph for inspection purposes, and creating an ionmill precursor file of the same form as previously described for the cases of digital and alphanumeric data. Subsequent processing to achieve a millstream file is as previously described. A separate software routine for each 3-D shape thus far milled has been written. While the equations for each shape are unique, the mechanics of array indexing, data formatting, and file writing and conversion are the same for all shapes in this category. The illustrative example below shows typical software required to generate a 3-D feature (in this case, a screw thread).

Set up indices:
$N := 255\ M := 255\ i := 0 \ldots N\ j := 0 \ldots M$
$Q := (N + 1) \cdot (M + 1)\ k := 0 \ldots Q - 1$
Create an X,Y array:

$$X_{i,j} := \text{floor}\left(i - 2047 - \frac{N+1}{2}\right)\ \text{WRITE}(X) := X_{i,j}\ Mx_k := \text{READ}(X)$$

$$Y_{i,j} := \text{floor}\left(j + 2047 - \frac{N+1}{2}\right)\ \text{WRITE}(Y) := Y_{i,j}\ My_k := \text{READ}(Y)$$

$Mxy := \text{augument}(Mx, My)$
Create the dwell time map:
$$x_i = \frac{4095i}{N} - 2047\ y_j = \frac{4095j}{M} - 2047$$

$$r_{i,j} := \text{floor}[\sqrt{|(x_i)^2 + (y_j)^2|}\ ]$$

Figure 4:
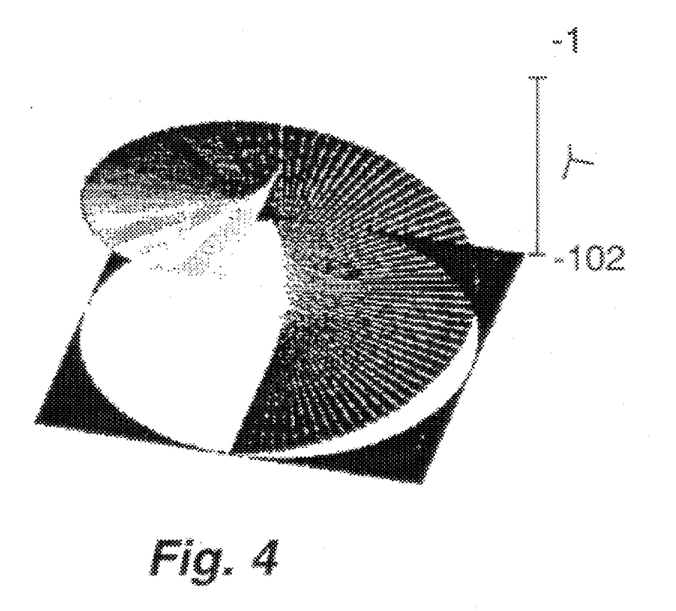
FIG. 4 shows an example of a mathematically generated shape used for a 3-D ion milling from a fourth generation software routine running inside Mathcad.
Figure 5:
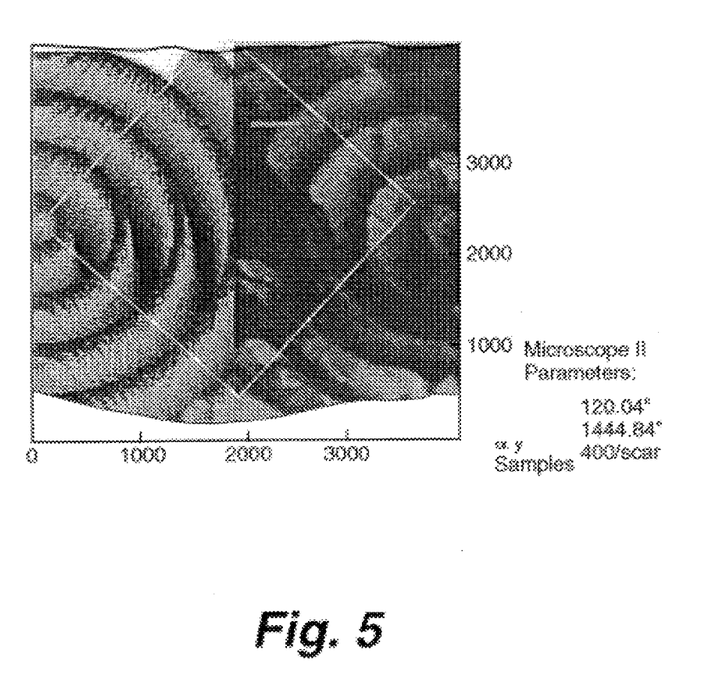
FIG. 5 shows an Atomic Force Microscope image of the milled structure from the 3-D ion milling of FIG. 4.

$t_{i,j} := \text{floor}[(\text{angle}(x_i + y_j) - 6.279) \cdot 16]$
$a := \min(t)\ a = -101\ T_{i,j} := \text{if}(r_{i,j} < x_N,\ t_{i,j} - 1, a - 1)$
Create the mill file of dwell(x,y):
$\text{WRITE}(T) = T_{i,j}\ Mt_k := \text{READ}(T)$
$Mtxy := \text{augment}(Mt, Mxy)\ \text{rows}(Mtxy) = 65536$
$\text{PRNCOLWIDTH} := 0$
$\text{PRNPRECISION} = 4$
$\text{WRITEPRN}(\text{screw1}) := Mtxy$ FIG. 4 shows a plot of the 3-D structure generated above, while FIG. 5. shows an Atomic Force Microscope image of the actual milled structure.

Using the techniques described above, one could extend the method to mill 3-D shapes according to grayscale or color pixel values extracted from video-generated TIFF, Bitmap, TARGA, or other graphics files. Data from the shapes could be recovered from the depth information available from scanning probe techniques such as atomic force microscopy and scanning tunneling microscopy.

The present invention is more particularly described in the following example which is intended as illustrative only, since numerous modifications and variations will be apparent to those skilled in the art.

EXAMPLE 1

A total of 52 alphanumeric characters were typed including all of the lower case and upper case letters of the alphabet. These typed letters were then scanned into a data file, converted into the millstream file for recognition by the software of an FEI Ionmill machine and the machine etched or micromilled the characters onto a high carbon steel (HCS) dowel pin. The characters had a size of 10 microns and occupied a total space on the dowel pin of 520 square microns. An additional 4 characters were written on the same HCS dowel at the scale of 1 square micron per character. To retrieve the milled data, a scanned video print of the actual milled surface magnified 500 times was fed into a commercial character recognition software application. The results of this test showed that even at an untrained level, the character recognition program could recognize a majority of the milled characters. The milled characters had an aspect ratio of depth to width of at least 15 as determined by the measurement limit of Atomic Force Microscopy.

Although the present invention has been described with reference to specific details, it is not intended that such details should be regarded as limitations upon the scope of the invention, except as and to the extent that they are included in the accompanying claims.

What is claimed is:

1. A process of machining a bandpass filter microstructure having a milled depth to milled horizontal cut ratio of greater than about 10 within a target substrate comprising:

placing a target substrate within an ultrahigh vacuum environment;

producing a computer data file adapted for operation of a computer-controlled focused ion beam so as to form a milled bandpass filter microstructure in said target substrate; and, exposing said target substrate to said computer-controlled focused ion beam, said computer-controlled focused ion beam controlled by software utilizing said computer data file whereby a milled bandpass filter microstructure having a milled depth to milled horizontal cut ratio of greater than about 10 is formed in said target substrate.

2. A process of machining a data storage medium microstructure having a milled depth to milled horizontal cut ratio of greater than about 10 within a target substrate comprising:

placing a target substrate within an ultrahigh vacuum environment;

producing a computer data file adapted for operation of a computer-controlled focused ion beam so as to form a milled data storage medium microstructure in said target substrate; and, exposing said target substrate to said computer-controlled focused ion beam, said computer-controlled focused ion beam controlled by software utilizing said computer data file whereby a milled data storage medium microstructure having a milled depth to milled horizontal cut ratio of greater than about 10 is formed in said target substrate.

* * * * *